United States Patent
Kobayashi et al.

(10) Patent No.: US 6,830,458 B2
(45) Date of Patent: Dec. 14, 2004

(54) APPARATUS INCORPORATING ELECTRONIC-PARTS-IMPLEMENTING BOARD AND A METHOD FOR INCORPORATING ELECTRONIC-PARTS-IMPLEMENTING BOARD

(75) Inventors: Norio Kobayashi, Kanagawa (JP); Hideaki Kurachi, Kanagawa (JP); Shuhei Nakada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/657,344

(22) Filed: Sep. 8, 2003

(65) Prior Publication Data

US 2004/0196624 A1 Oct. 7, 2004

(30) Foreign Application Priority Data

Sep. 10, 2002 (JP) ..................................... P2002-264407

(51) Int. Cl.⁷ ............................................. H01R 13/62
(52) U.S. Cl. .......................... 439/59; 439/325; 361/683
(58) Field of Search .......................... 439/157, 629–631, 439/55, 59–62; 361/637–638, 683, 686

(56) References Cited

U.S. PATENT DOCUMENTS

| | | | | |
|---|---|---|---|---|
| 5,648,891 A | * | 7/1997 | Gierut | 361/788 |
| 5,822,195 A | * | 10/1998 | Brench et al. | 361/818 |
| 6,243,273 B1 | * | 6/2001 | Beun et al. | 361/796 |
| 6,422,876 B1 | * | 7/2002 | Fitzgerald et al. | 439/61 |
| 6,762,362 B1 | * | 7/2004 | Cavanaugh et al. | 174/68.2 |
| 6,772,246 B2 | * | 8/2004 | Kim et al. | 710/62 |
| 2004/0066615 A1 | * | 4/2004 | Pavesi et al. | 361/683 |

* cited by examiner

Primary Examiner—Michael C. Zarroli
(74) Attorney, Agent, or Firm—Jay H. Maioli (57) ABSTRACT

A housing having openings for exposing the operation surfaces of a peripheral component interconnect (PCI) expansion card and a communication and network riser (CNR) expansion card to the outside at its front surface and at its back surface, respectively. A motherboard, which is incorporated in the housing, has multiple connectors arranged at specific intervals. The PCI expansion card has a PCI card electrode and is inserted into and connected with one of the connectors of the motherboard. A CNR expansion card has a CNR card electrode and is inserted into and connected with another one of the connectors of the motherboard. The PCI expansion card and the CNR expansion card are attached to the corresponding connectors in the motherboard, with the electronic-parts-implementing surface of the PCI expansion card and the electronic-parts-implementing surface of the CNR expansion card facing each other.

14 Claims, 10 Drawing Sheets

APPARATUS INCORPORATING ELECTRONIC-PARTS-IMPLEMENTING BOARD AND A METHOD FOR INCORPORATING ELECTRONIC-PARTS-IMPLEMENTING BOARD

BACKGROUND OF THE INVENTION

1. Field of the Invention

The present invention generally relates to an information processor. It, more particularly, relates to a desktop personal computer incorporating a motherboard of ATX (including Micro ATX) into which electronic-parts-implementing boards for extension of functionality of the motherboard are incorporated, and a method for incorporating the electronic-parts-implementing boards.

2. Description of Related Art

In recent years, the information processor such as the desktop personal computer has been increasingly used. Such the computer incorporates an electronic-parts-implementing board that implements a central processing unit, a memory IC chip and the like and electronic parts such as an interface card, a power supply unit, a CD-RW driver, a floppy (R) disc (FD) driver. In addition to them, the computer has a slot for extension of functionality on a back surface of its housing The slot is available for incorporating into the computer a communication and network riser (CNR) expansion card. An opening formed on a front surface of the housing is available for incorporating into the computer a peripheral component interconnect (PCI) expansion card.

Japanese Patent Publication No. 2002-108503 discloses the incorporation of electronic parts such as PCI expansion card and CNR expansion card of the above types, particularly, information processors. The Patent Publication discloses a configuration of this information processor wherein a motherboard implementing a connector for interface card and the like is screwed to a frame chassis, and an electronic-parts-implementing board such as PCI expansion card and CNR expansion card is capable of being incorporated (page 3 FIG. 5 thereof). The motherboard may incorporate an electronic-parts-implementing board that conforms to ATX (including Micro ATX) standards and the like.

The ATX standards are standards for a motherboard for PC/AT converter that Intel Corp. has presented in 1995. In the ATX standards, the shape and dimension of the board and the locations of the respective parts and slots are strictly determined. Before the presentation of the ATX standards, the respective manufactures have manufactured motherboards in accordance with their own respective standards. The ATX standards, however, determine detailed rules. This causes the compatibility between parts to be increased, thereby allowing a larger number of manufactures to participate in the market. The Micro ATX standards determine a size of board smaller than that of the ATX standards, and have a modified upper limit of the number of extension slots from the ATX specification. Flex ATX standards determine a specification of further smaller-sized board than that of the Micro ATX standards.

In a method for incorporating an expansion card in a computer of a conventional system, there are problems as follows:

(1) For example, a slot at the lowest position in the motherboard of ATX standards and the like is exclusively usable at only either one of a back surface of the housing or a front surface of the housing for the following reason. That is, even if the PCI expansion card and the CNR expansion card are structured so as to be usable simultaneously in terms of electric circuits, the brackets of these cards spatially overlap with each other. Therefore, the bracket of only either one of these cards can be inserted into the slot and the inserted bracket completely occupies the parts attachment space in the motherboard.

(2) Therefore, when the bracket of the standard in either the PCI expansion card or the CNR expansion card is used, the bracket of the standard in the remaining card cannot be used. For this reason, it is impossible to simultaneously use the electronic-parts-implementing boards for expansion at the back surface of the housing and at the front surface of the housing.

(3) It is conceivable that the PCI expansion card and the CNR expansion card are mounted to the connector for an interface card in a state where the parts packaging surfaces of the PCI expansion card and the CNR expansion card are opposed to each other. However, if electronic parts are mounted so as to be opposed to each other without making any special arrangement, tall electronic parts such as capacitors hit against each other at the time of transportation to cause connectors to loosen or to cause connection failure.

SUMMARY OF THE INVENTION

The present invention has solved the problems in the above related arts, and an objective thereof is to provide an apparatus allowing electronic-parts-implementing boards to be incorporated thereinto in which electronic-parts-implementing boards for extension of functionality can be simultaneously used at a back surface of the housing and at a front surface of the housing, although such the boards have been usable either at the back surface of the housing or the front surface of the housing, and a method for incorporating the electronic-parts-implementing boards.

According to one aspect of the invention, the apparatus allows the electronic-parts-implementing boards to be incorporated into the apparatus. The apparatus comprises a housing having at least a front surface and a back surface.

The apparatus also comprises a first electronic-parts-implementing board, for example, a motherboard, having multiple board connection terminals each being arranged apart at a specific interval thereon. The first electronic-parts-implementing board is incorporated in the housing.

The apparatus further comprises a second electronic-parts-implementing board, for example, a PCI expansion board and CNR expansion board, having a group of electrodes. The second electronic-parts-implementing board is connected with one of the multiple board connection terminals of the first electronic-parts-implementing board with the group of electrodes of the second electronic-parts-implementing board being inserted into one of the multiple board connection terminals of the first electronic-parts-implementing board. The apparatus still further comprises a third electronic-parts-implementing board, for example, a PCI expansion board and CNR expansion board, having a group of electrodes. The third electronic-parts-implementing board is connected with other one of the multiple board connection terminals of the first electronic-parts implementing board with the group of electrodes of the third electronic-parts-implementing board being inserted into other one of the multiple board connection terminals of the first electronic-parts-implementing board.

Each of the front and back surfaces of the housing has an opening for allowing an operation surface of one of the second and third electronic-parts-implementing boards to be exposed to the outside.

In the second and third electronic-parts-implementing boards, the respective groups of electrodes of the second and third electronic-parts-implementing boards are inserted to the corresponding board connection terminals of the first electronic-parts-implementing board with an electronic-parts-implementing surface of the second electronic-parts-implementing board and an electronic-parts-implementing surface of the third electronic-parts-implementing board being faced to each other.

According to the apparatus of the present invention, at the time of incorporating the electronic-parts-implementing board for extension of functionality to a specific housing, the housing has openings for allowing the operation surfaces of the electronic-parts-implementing boards to be exposed to the outside at its front surface and the back surface. In the housing, a first electronic-parts-implementing board having multiple board connection terminals arranged at specific intervals is incorporated.

Under the conditions described above, the electronic-parts-implementing surface of the second electronic-parts-implementing board having a group of electrodes for connecting the second electronic-parts-implementing board with the first electronic-parts-implementing board and the electronic-parts-implementing surface of the third electronic-parts-implementing board having a group of electrodes for connecting the third electronic-parts-implementing board with the first electronic-parts-implementing board are opposed to each other. Then, the respective groups of electrodes of the second and third electronic-parts-implementing boards are inserted to the corresponding board connection terminals of the first electronic-parts-implementing board inside the housing while the operation surface of the second electronic-parts-implementing board is exposed from the opening at the front surface of the housing and the operation surface of the third electronic-parts-implementing board is exposed from the opening at the back surface of the housing.

According to the invention, the second electronic-parts-implementing board of which operation surface for the electronic parts is exposed at the front surface of the housing and the third electronic-parts-implementing board of which operation surface for the electronic parts is exposed at the back surface of the housing can be implemented to the first electronic-parts-implementing board inside the housing by use of one and the same electronic-parts-implementing space. This allows the second electronic-parts-implementing board such as a PCI expansion card and the third electronic-parts-implementing board such as a CNR expansion card to be simultaneously used at the front and back surfaces of the housing, respectively, although only either one of such the boards has been exclusively usable at the back surface of the housing or the front surface of the housing in a conventional system.

A method according to the invention allows an electronic-parts-implementing board to be incorporated with an operation surface of the electronic-parts-implementing board being exposed to the outside through an opening previously formed in a specific housing at its front surface and its back surface. The method comprises the step of incorporating a first electronic-parts-implementing board having multiple board connecting terminals each being arranged apart at a specific interval to an inside of the housing.

The method also comprises the step of preparing a second electronic-parts-implementing board having a group of electrodes for connecting the second electronic-parts-implementing board with the first electronic-parts-implementing board and preparing a third electronic-parts-implementing board having a group of electrodes for connecting the third electronic-parts-implementing board with the first electronic-parts-implementing board. In this step, at the same time, locating the second and third electronic-parts-implementing boards with an electronic-parts-implementing surface of the second electronic-parts-implementing board and an electronic-parts-implementing surface of the third electronic-parts-implementing board being faced to each other.

The method further comprises the step of connecting the group of electrodes of the second electronic-parts-implementing board with one of the board connection terminals of the first electronic-parts-implementing board, and connecting the group of electrodes of the third electronic-parts-implementing board with other one of the board connection terminals of the first electronic-parts-implementing board.

In this case, the respective groups of electrodes of the second and third electronic-parts-implementing boards may be electrically connected with the board connection terminals of the first electronic-parts-implementing board with the operation surface of the second electronic-parts-implementing board being exposed from the opening at the front surface of the housing and the operation surface of the third electronic-parts-implementing board being exposed from the opening at the back surface of the housing.

According to the method of the present invention, the second electronic-parts-implementing board of which operation surface for the electronic parts is exposed at the front surface of the housing and the third electronic-parts-implementing board of which operation surface for the electronic parts is exposed at the back surface of the housing can be simultaneously incorporated to the first electronic-parts-implementing board inside the housing. This allows the electronic-parts-implementing boards for extension of functionality to be simultaneously used at the back surface of the housing and at the front surface of the housing, respectively, although only either one of such the boards has been exclusively usable at the back surface of the housing or the front surface of the housing in a conventional system.

The concluding portion of this specification particularly points out and directly claims the subject matter of the present invention. However those skill in the art will best understand both the organization and method of operation of the invention, together with further advantages and objects thereof, by reading the remaining portions of the specification in view of the accompanying drawing(s) wherein like reference characters refer to like elements.

DETAILED DESCRIPTION OF THE PREFERRED EMBODIMENT

Hereinafter, an embodiment of an apparatus allowing electronic-parts-implementing boards to be incorporated thereinto and a method for allowing an electronic-parts-implementing board to be incorporated according to the present invention will be described with reference to the drawings.

Figure 1:
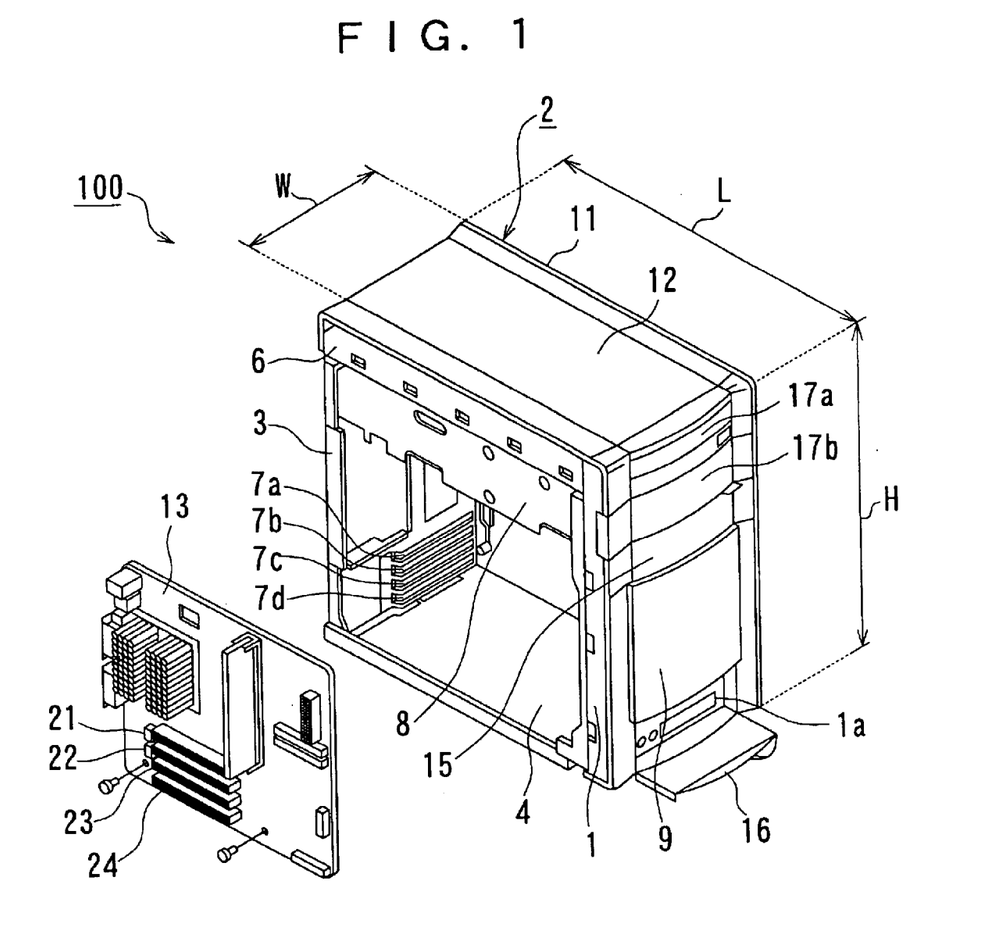
FIG. 1 is a perspective view showing a configuration of a personal computer 100 as an embodiment of the present invention, including an electronic-parts-implementing board.

FIG. 1 is a perspective view showing a configuration of a personal computer 100 including an electronic-parts-implementing board as an embodiment according to the present invention.

In this embodiment, when incorporating electronic-parts-implementing boards for extension of functionality in a specific housing, an electronic-parts-implementing surface of an electronic-parts-implementing board having a group of electrodes for connection with an electronic-parts-implementing board inside the housing and an electronic-parts-implementing surface of the other electronic-parts-implementing board having a group of electrodes for connection with the electronic-parts-implementing board inside the housing are faced to each other. The respective groups of electrodes of said second and third electronic-parts-implementing boards are electrically connected with the corresponding board connection terminals of the electronic-parts-implementing board inside the housing with the operation surface of the electronic-parts-implementing board being exposed from the opening at the front surface of the housing and the operation surface of the other electronic-parts-implementing board being exposed from the opening at the back surface of the housing.

In this manner, it becomes possible to use the electronic-parts-implementing boards for extension of functionality at a back surface of the housing and a front surface of the housing simultaneously, although only either one of such the boards has been exclusively usable at the back surface of the housing or the front surface of the housing in a conventional system.

The desktop personal computer (hereinafter, simply referred to as a computer) 100 shown in FIG. 1 is an example of an apparatus allowing an electronic-parts-implementing board to be incorporated thereinto, and electronic-parts-implementing boards for extension of functionality may be incorporated in this computer 100. In the computer 100, illustrations of a monitor, a keyboard, a mouse and the like are omitted. The computer 100 includes a motherboard 13 as an example of a first electronic-parts-implementing board which implements a central processing unit (CPU), a memory IC chip and the like, and also includes an interface card and a power supply unit attached thereto.

The computer 100 includes a metallic housing 2 of a specific size. As shown in FIG. 1, the housing 2 is covered with, for example, a resin front panel 9, a left side panel, a right side panel 11, and a top panel 12, which are detachable. The size of the computer main body covered with these panels 9 to 12 is about 20 cm in width W, about 38 cm in depth L, and about 38 cm in height H. To the front panel 9, doors 15, 16 and lids 17a, 17b are movably attached. In FIG. 1, the door 16 is in its open state, and an external connection terminal and a card insertion hole for a PC card interface are provided inside it. The card insertion hole is exposed from an opening 1a of a front plate 1 of the housing 2.

The computer 100 has the housing 2 of a specific size. The housing 2 includes, for example, a front plate 1, a frame chassis 3, a bottom plate 4, a top plate 6 and a side plate 8. The front plate (i.e. a specific surface) 1 is formed with an opening 1a for exposing the operation surface of the PC card. An unillustrated left side panel, located at a left side of the computer main body when viewed from the front position at which the computer 100 is operated in this example, is removed to show an electronic-parts-implementing opening for use in attaching and detaching the motherboard 13 and other electronic parts. In this structure, it becomes possible to remove the motherboard 13, the expansion card, and the like through the same opening only by removing the left side panel of the computer 100, without removing the front panel 9, the right side panel 11, the top panel 12 and the like.

Inside the housing 2, the motherboard 13 is attached. The motherboard 13 conforms to the ATX (including Micro ATX) standards, and includes a board having a size smaller than that of ATX specification and has a modified upper limit of the number of expansion slots from the ATX specification. The ATX standards are standards for the motherboard 13 for use in the PC/AT converter. The size of the substrate is 244×244 mm (9.6 inches) at the maximum. In the Micro ATX standards, in order to achieve smaller-sized specification than the ATX specification, the number of the portions for mounting the expansion slots is reduced from the ATX standards by 3 so that 4 slots at the maximum can be mounted.

The motherboard 13 of the Micro ATX specification is structured so as to be attachable to the housing 2 conforming to the ATX standards. The housing 2 is formed with, at the front plate 1 and the frame chassis 3 at the back surface, openings for exposing the operation surface of the electronic-parts-implementing board for extension of functionality to the outside.

Figure 2:
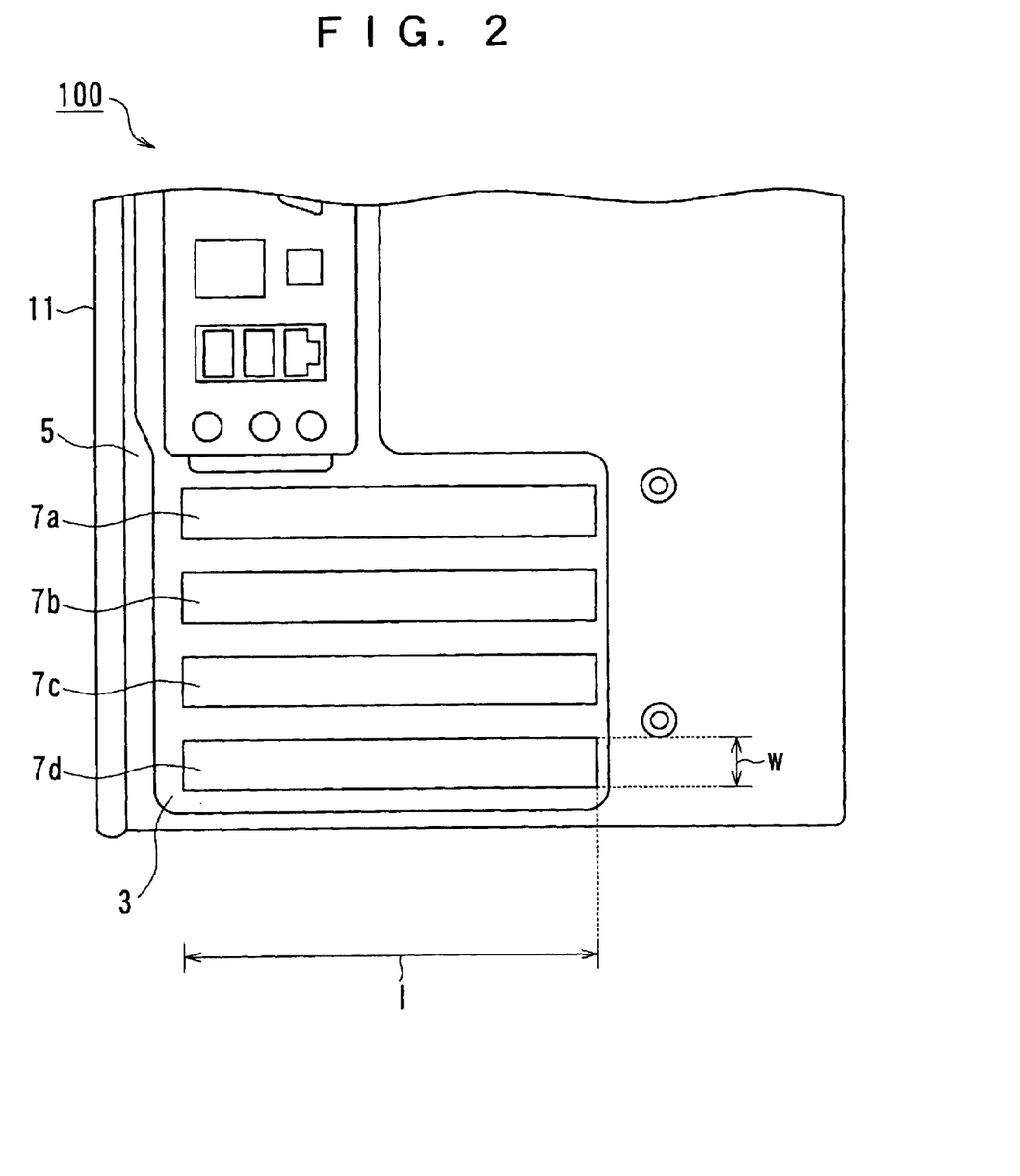
FIG. 2 is a partial back view of a computer 100 for illustrating an exemplary arrangement of slots 7a to 7d for expansion.

FIG. 2 is a partial back view of the computer 100 for illustrating an exemplary arrangement of the expansion slots. On the frame chassis 3 at the back surface of the computer 100 shown in FIG. 2, a slot (i.e. an opening) 7a for attaching an expansion card and the like is arranged. When not used, the slot 7a and the like are covered with a screen plate. In this example, 4 slots 7a to 7b are formed. The size of the slot 7a and the like is standardized, and the width w is about 1.6 cm and its length 1 is about 10 cm. This dimension is determined so as to allow the attachment of the bracket of the expansion card thereto. The slots 7a to 7d are formed on the frame chassis 3 which constitutes the housing 2, for example. The frame chassis 3 is connected to the right side plate 5, and the right side plate 5 is attached in such a manner that is covered with the right side panel 11.

In this example, the parts attachment space of the lower-most slot 7d is utilized by an electronic-parts-implementing board for extension of functionality such as a PC card which is used in a state where its operation surface is exposed from the opening 1a of the front plate 1 to the outside, and an electronic-parts-implementing board such as an outside line connector (i.e. an outside connection terminal) which is used in a state where its operation surface is exposed through the slot 7d of the frame chassis 3 to the outside.

Figure 3:
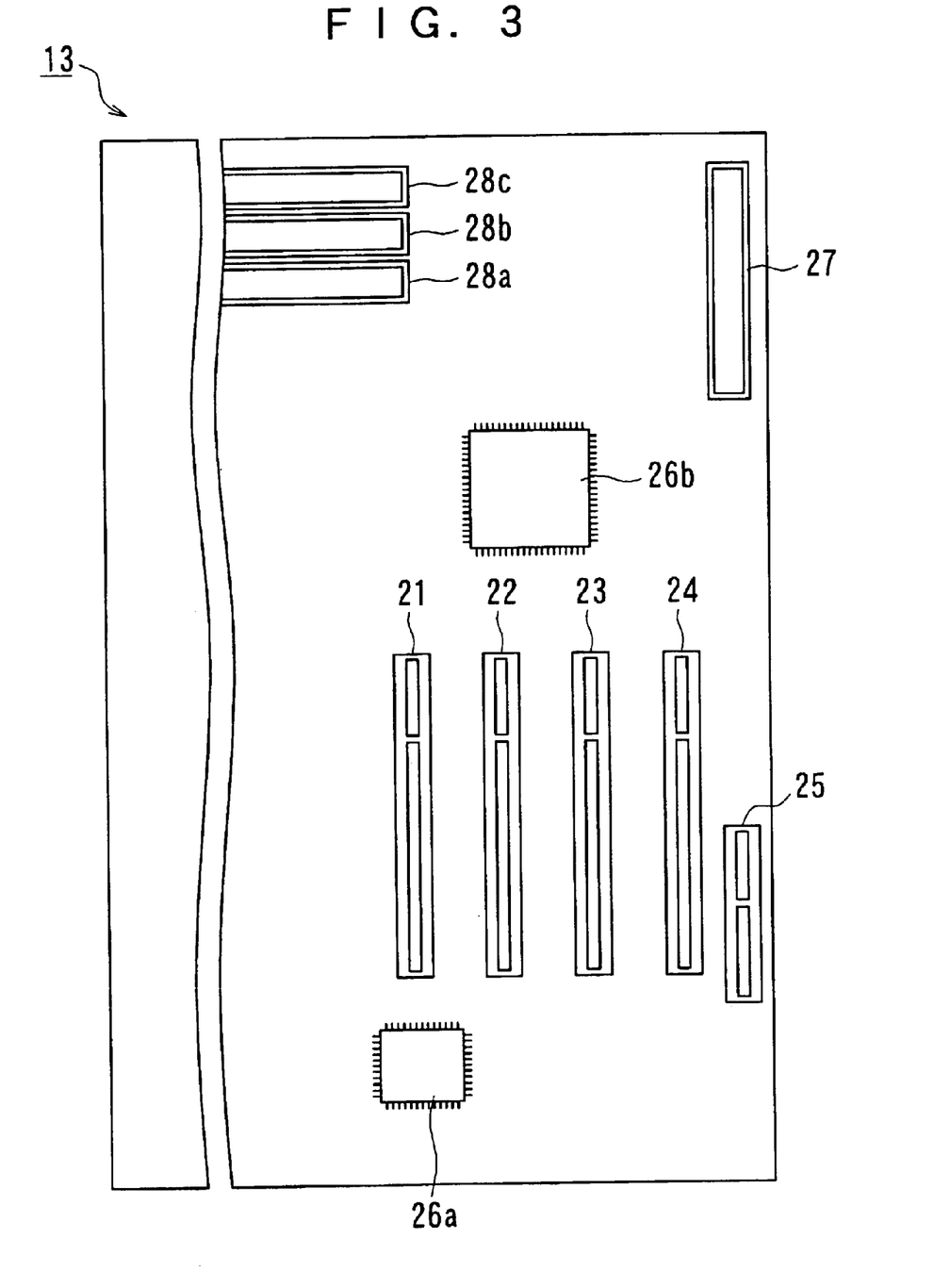
FIG. 3 is a top plane view showing a configuration of a motherboard 13.

FIG. 3 is a top plane view of the motherboard 13 for showing a configuration thereof. On the motherboard 13 shown in FIG. 3, multiple board connection terminals (hereinafter, referred to as "connectors") 21, 22, 23, 24, 25 for interface cards are arranged at specific intervals. In this example, the number of the arranged connectors 21, 22, 23, 24, 25 is larger than the number of the slots 7a to 7d by one. This is because the parts attachment space of the lowermost slot 7d shown in FIG. 2 is effectively shared by two expansion cards. In this example, the connectors 21, 22, 23, 24 are arranged at substantially the same interval, whereas the interval between the connector 24 and the connector 25 is narrower than the interval between the remaining connectors. This is because the parts attachment space is effectively utilized by opposing A side surfaces of the cards to each other.

These connectors 21, 22, 23, 24, 25 are structured so that an electronic-parts-implementing card for extension of functionality as an example of the second electronic-parts-implementing board is connectable thereto. In this example, it is assumed that a peripheral component interconnect (PCI) expansion card 40 as the second electronic-parts-implementing board is mounted to the motherboard 13 by use of the connector 24. It is a matter of course that, in addition to the connectors 21, 22, 23, 24, 25, the motherboard 13 is also provided with IC chips 26a, 26b, other connectors 27, 28a to 28c and other unillustrated resistors and capacitors and the like.

Figure 5:
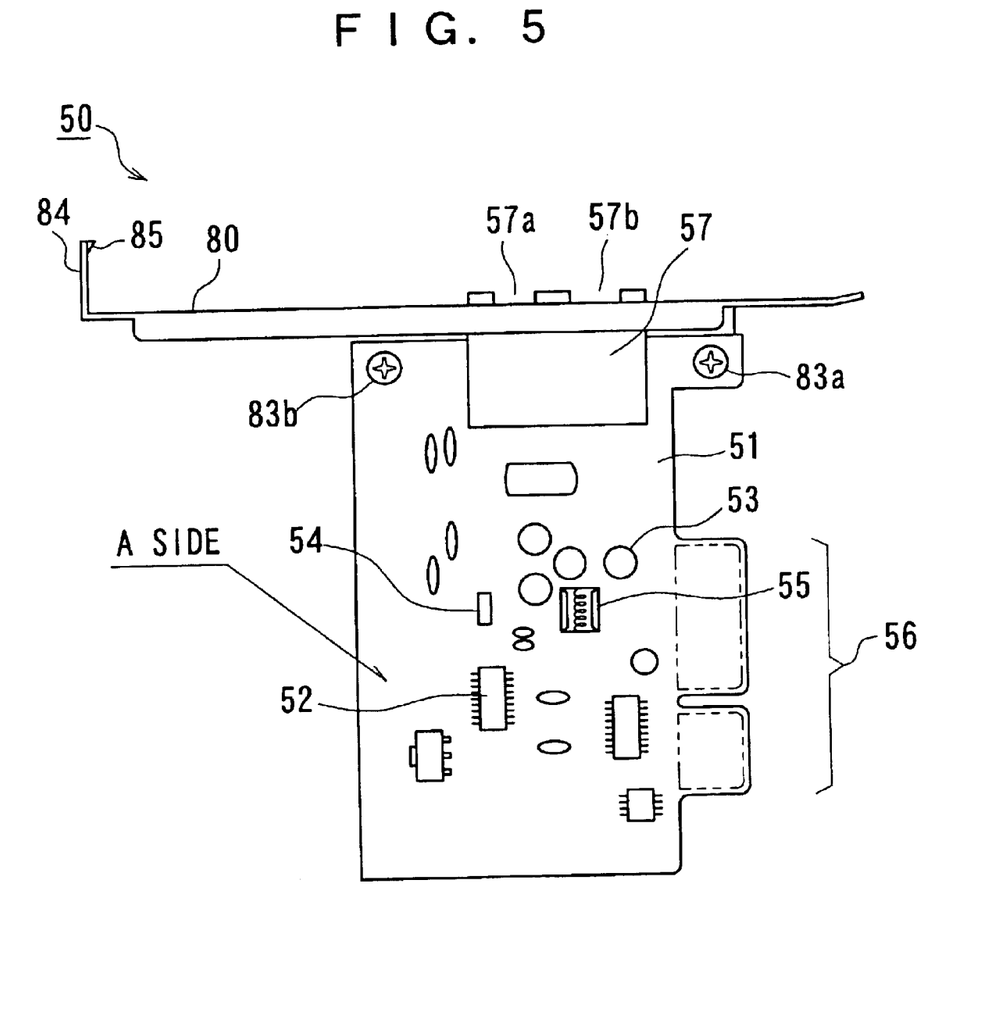
FIG. 5 is a diagram showing a configuration of an A side surface of a CNR expansion card 50.

In this example, an electronic-parts-implementing board for extension of functionality as an example of the third electronic-parts-implementing board is connectable to the connector located at the lowermost position on the motherboard 13. In this example, it is assumed that a communication and network riser (CNR) expansion card 50 such as shown in FIG. 5 is mounted by use of the connector 25 as the third electronic-parts-implementing board. The CNR expansion card 50 conforms to the riser card standards that the Intel Corporation presented in February 2000, and is used for providing the features of LAN audio, modem, USB and the like to this computer.

There is a merit that different communication standards varying from country to country can be easily conformed only by use of the riser cards without making any arrangement to the motherboard 13. The CNR expansion card 50 is out of the standards of the expansion slots 7a to 7d such as the PCI bus. Therefore, it is not assumed that a riser card conforming to the CNR standards is sold alone. Instead, a riser card conforming to the CNR standards is mounted to computers by manufactures at the time of shipment.

Figure 4:
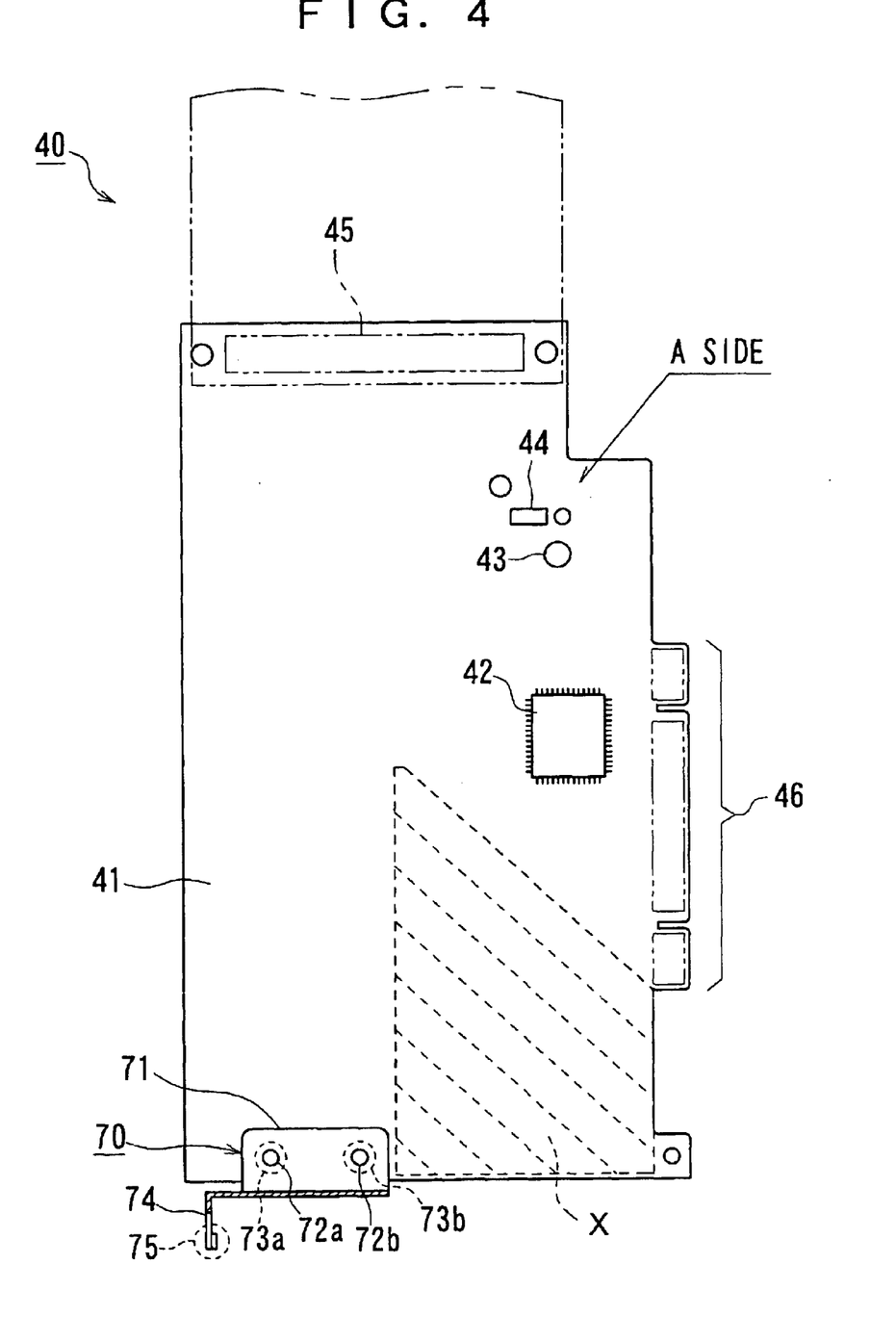
FIG. 4 is a diagram showing a configuration of an A side surface of a PCI expansion card 40.

FIG. 4 is a diagram showing a configuration of an A side surface of the PCI expansion card 40. The PCI expansion card 40 shown in FIG. 4 is constituted by implementing electronic parts such as an IC chip 42, a resistor 43, and resistor 44 on a printed circuit board 41. Hereinafter, an electronic-parts-implementing surface on which the electronic parts such as an IC chip 42, a capacitor 43, and a resistor 44 are implemented is referred to as an A side surface, and non-electronic-parts-implementing surface on which no electronic parts are implemented is referred to as a B side surface. A connector may be arranged on the B side surface.

In this example, a connector 45 is provided on the B side surface of the printed circuit board 41. An unillustrated printed circuit board having a PC card operation panel is fittedly inserted and connected with the connector 45. This is to mount the PC card to the operation panel on the front plate 1 of the housing 2 for data processing. A group of electrodes 46 for connection with another board (hereinafter, referred to as a PCI card electrode) is provided at one end of the printed circuit board 41. The PCI card electrode 46 is fittedly inserted and connected to the connector 24 of the motherboard 13. The PCI card electrodes 46 are formed on both of the A side surface and the B side surface of the printed circuit board 41.

In this example, a support-fixing member (hereinafter, referred to as a bracket) 70 is attached to the PCI expansion card 40. This bracket 70 is additionally manufactured for joint tightening, and has a L-shaped main member 71. The bracket 70 is manufactured by stamping an iron plate having a thickness of about 1 mm and then folding the resultant piece. The main member 71 is formed with two female screws 72a, 72b for board fixation, for example. The printed circuit board 41 and the main member 71 are fixed to each other by screwing two male screws 73a, 73b into these two female screws 72a, 72b.

The bracket 70 has another engaging portion 74 for screw fixation and is fixed to the frame chassis 3 together with the bracket 80 of the CNR expansion card 50. The engaging portion 74 is formed by a U-shaped notch portion. In this example, the bracket 70 is attached to the A side surface of the PCI expansion card 40. This is to make it easy to overlap the bracket 70 with the bracket 80 of the CNR expansion card 50.

The portion marked with oblique lines in the PCI expansion card 40 shown in FIG. 4 is an electronic-parts-implementing prohibitive region X. In this region, any formation of electronic parts such as a printed wiring, an IC chip, a capacitor, a resistor and the like is prohibited. If any electronic part is implemented in the electronic-parts-implementing prohibitive region X, the electronic parts physically comes into contact with the electronic parts of the CNR expansion card 50, and it becomes impossible to efficiently mount two expansion cards. That is, the CNR expansion card 50 is attached to the motherboard 13 by use of a space of the electronic-parts-implementing prohibitive region X.

Further, in the portion enclosed with a broken circle line in the bracket 70 shown in FIG. 4, a convex projecting portion 75 for alignment is formed. The convex projecting portion 75 is so structured as to be easily fitted and inserted into the concave notch portion 85 for alignment formed beforehand in the bracket 80 of the CNR expansion card 50, which will be described later with reference to FIG. 6A. Specifically, at the time of joint tightening, the convex projecting portion 75 of the bracket 70 of the PCI expansion card is fitted and inserted into the concave notch portion 85 of the bracket 80 of the CNR expansion card 50.

Figure 6A:
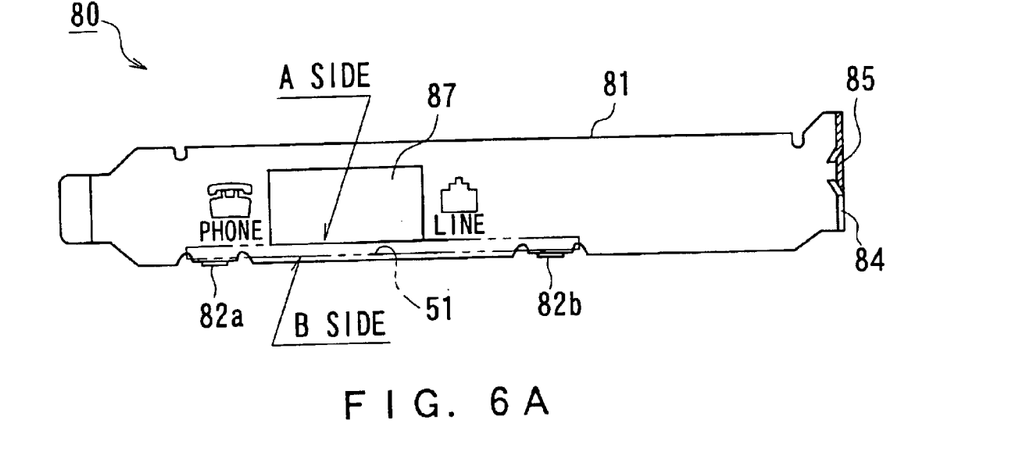
FIGS. 6A and 6B are diagrams respectively showing configurations of a front surface and an upper surface of a bracket 80.
Figure 6B:
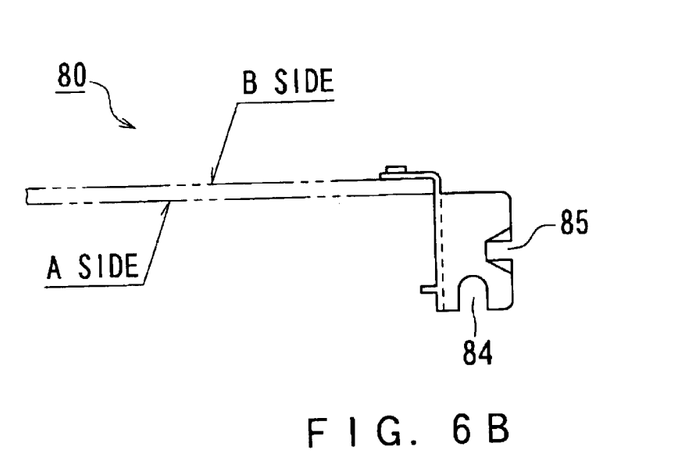

FIG. 5 is a diagram showing a configuration of an A side surface of the CNR expansion card 50. FIG. 6A is a front view of the bracket 80 showing a configuration thereof, and FIG. 6B is a diagram showing an exemplary structure of the upper surface thereof.

The CNR expansion card 50 shown in FIG. 5 implements electronic parts such as an IC chip 52, a capacitor 53, a resistor 54, a coil 55, connectors 57 for outside lines on a printed circuit board 51. At the time of use, one outside line connector 57a is connected to a line input line and the other outside connector 57b is connected to a telephone set. It is a matter of course that these electronic parts are implemented on the A side surface of the CNR expansion card 50.

On one end of the printed circuit board 51, a group of electrodes 56 for connecting the CNR expansion card 50 with a board (hereinafter, referred to as a CNR card electrode) 56 is provided. The CNR card electrode 56 is fittedly inserted and connected to the connector 25 of the motherboard 13. The CNR card electrode 56 is formed on both of the A side surface and the B side surface of the printed circuit board 41.

A bracket 80 having an engaging portion 84 for screw fixation such as shown in FIG. 6A is attached to the CNR expansion card 50. The bracket 80 is standardized beforehand, and is fixed to the frame chassis 3 together with the bracket 70 of the PCI expansion card 40. The bracket 80 has a strap-shaped main member 81. The bracket 80 is manufactured by stamping an iron plate having a thickness of about 1 mm and then folding the resultant piece, and after that, is plated with chromium and the like.

One end of the main member 81 is folded into L shape. An opening 87 is formed at a specific position of the main member 81 (i.e. at a position slightly shifted from the center). The double-hole type outside line connectors 57a, 57b are exposed to the outside from the opening 87. One side of the bracket 80 is formed with two female screws 82a, 82b for board fixation, for example. The printed circuit board 51 and the bracket 80 are fixed to each other by screwing two male screws 83a, 83b into these two female screws 82a, 82b. In the bracket 80 shown in FIG. 6A, the surface at the opening 87 side is an operation surface. Double-hole type outline connectors 57a, 57b are attached to the operation surface so as to be exposed to the outside from the opening 87.

The bracket 80 shown in FIG. 6B is attached to the B side surface of the CNR expansion card 50 so as to be screwed with the female screws 82a, 82b. This is to make it easy to overlap the bracket 80 with the bracket 70 of the PCI expansion card 40. In this example, when the bracket 80 is viewed from top in a state where the printed circuit board 51 is located at a left side, an engaging portion 84 constituted by a U-shaped notch portion is formed at a side folded into L shape. The engaging portion 84 is utilized when the bracket 70 of the PC expansion card 40 and the bracket 80 of the CNR expansion card 50 are overlapped with each other, and these brackets 70, 80 are jointly tightened with each other so as to be fixed to the frame chassis 3 of the housing 2 and the like.

In this example, a convex projecting portion 84 for alignment is formed at an upper right side of the U-shaped engaging portion 84 of the bracket 80 shown in FIG. 6B. The projecting portion 84 is fittedly inserted and engaged with a concave notch portion for alignment or a circular opening for alignment formed in the housing 2 beforehand. On the projecting portion 84, its side to be attached to the chassis has a convex shape, and the opposite side thereof has a concave shape. This is to fittedly insert the convex projecting portion 75 of the bracket 70 of the PCI expansion card 40 described above into the projecting portion 84. In this structure, it becomes easy to jointly tighten the bracket 70 of the PCI expansion card 40 and the bracket 80 of the CNR expansion card 50 to the housing 2.

The CNR expansion card 50 is combined with the PCI expansion card 40 by spatially utilizing the electronic-parts-implementing prohibitive region X of the PCI expansion card 40 described above. For example, the A side surface of the PCI expansion card 40 and the A side surface of the CNR expansion card 50 are opposed to each other; the operation surface of the PCI expansion card 40 is exposed from the opening of the front plate 1 of the housing 2; and the card electrodes 46, 56 of the PCI expansion card 40 and the CNR expansion card 50 respectively are electrically connected to the connectors 24, 25 of the motherboard 13 respectively in such a manner that the operation surface of the outside line connectors and the like of the CNR expansion card 50 is exposed from the slot 7d of the frame chassis 3 of the housing 2.

Figure 7:
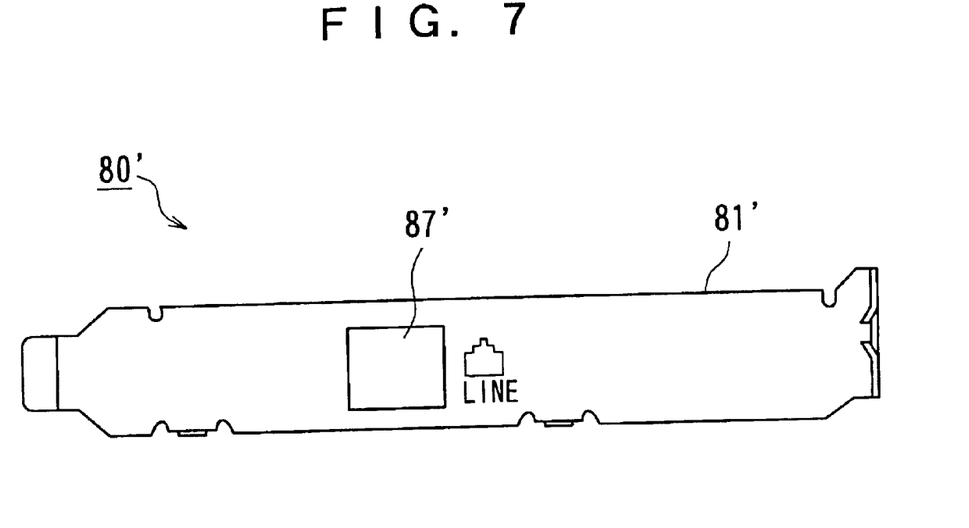
FIG. 7 is a front view showing a configuration of another bracket 80' for CNR expansion card.

FIG. 7 is a front view of another bracket 80' for CNR expansion card for showing a configuration thereof. One hole-type outside line connector, not shown, is attached to the bracket 80' shown in FIG. 7. A main member 81' is formed with an opening 87' to which the one hole-type outside line connector is attachable. When use, this outside line connector is connected to only the line input line. To the bracket 80' is applicable the method for allowing an electronic-parts-implementing board to be incorporated according to the invention.

Figure 8:
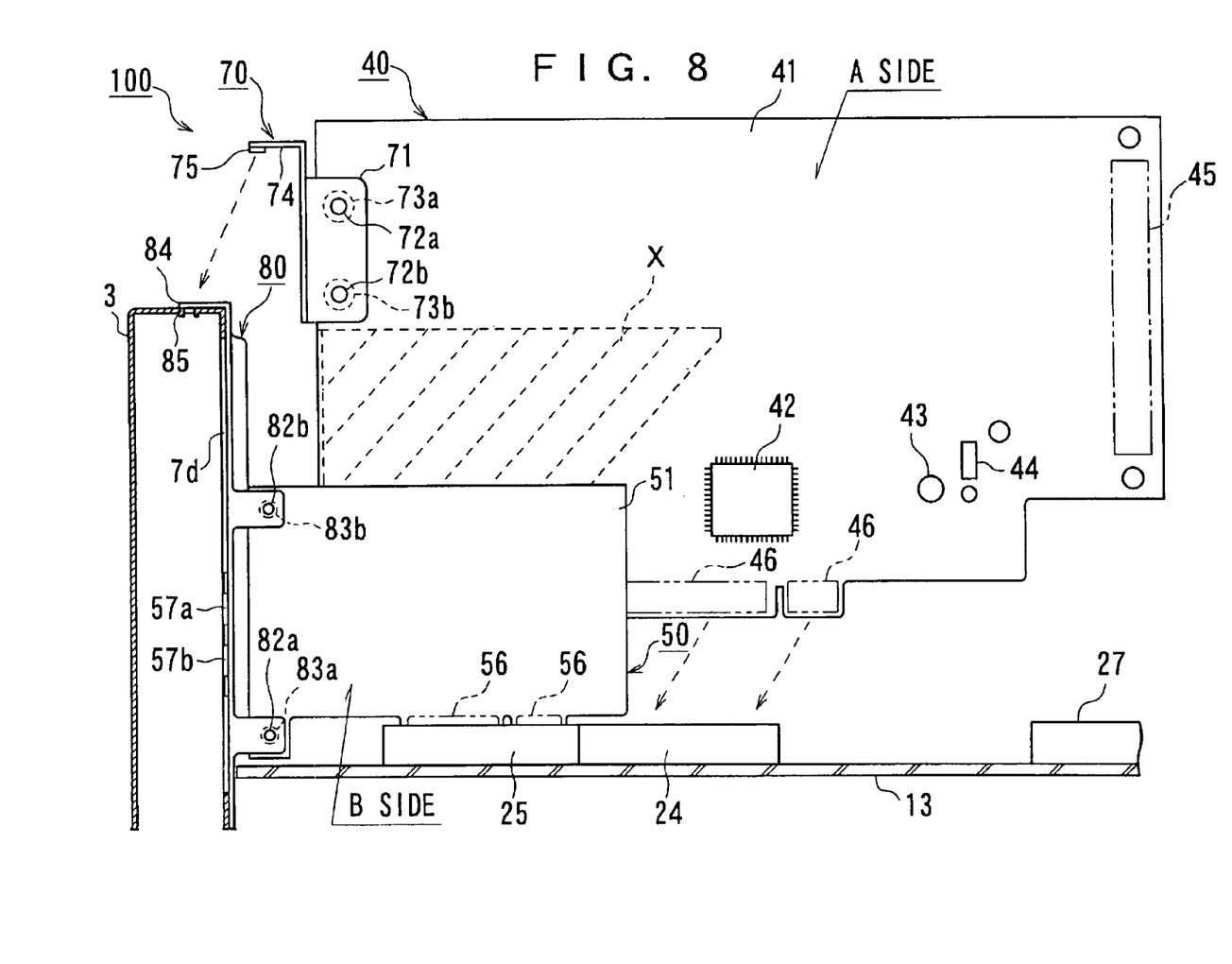
FIG. 8 is a diagram showing an exemplary attachment of a PCI expansion card 40 and a CNR expansion card 50 from a front side thereof.
Figure 9:
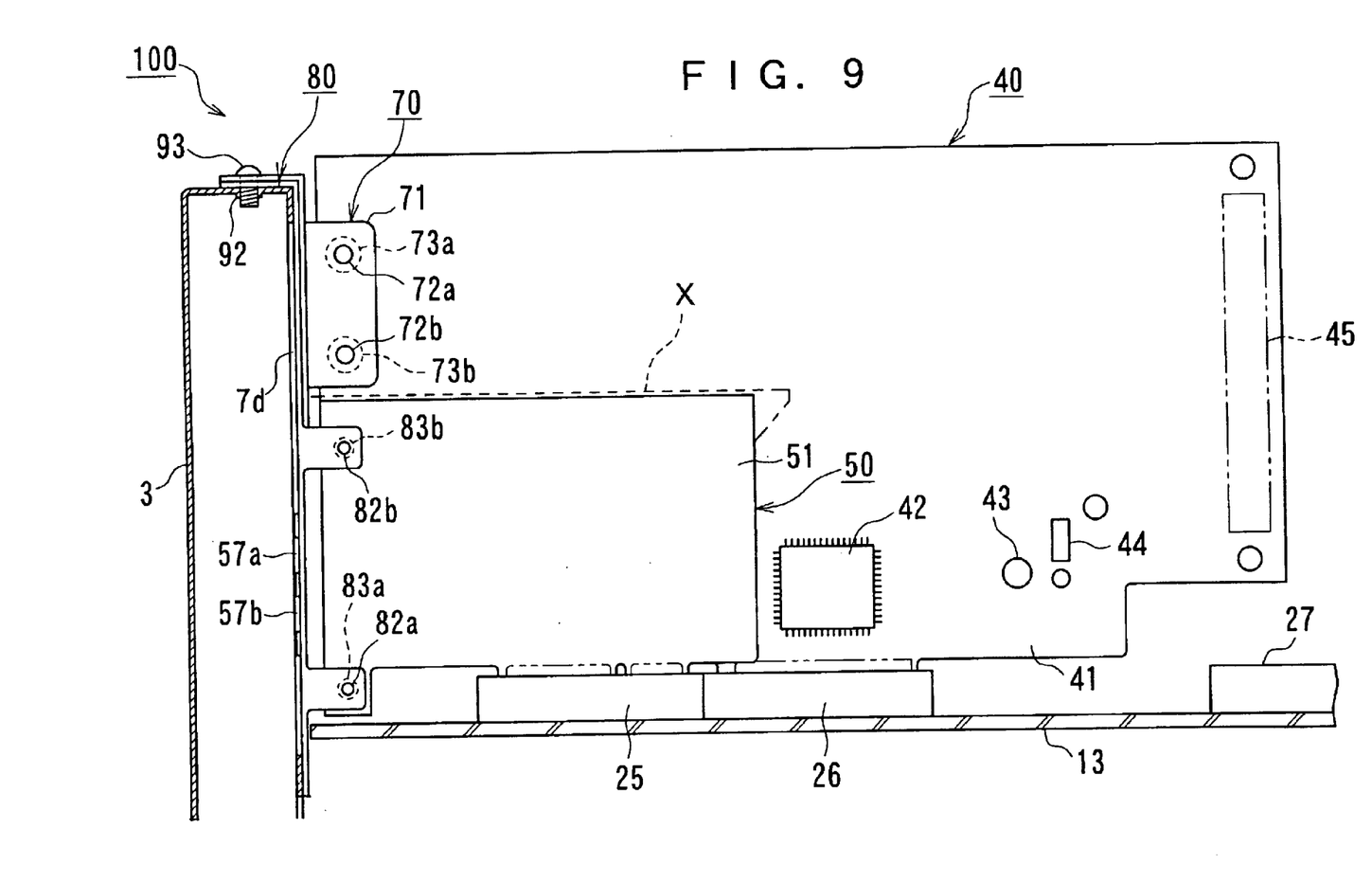
FIG. 9 is a diagram showing an exemplary structure of the expansion cards 40, 50 wherein they are jointly tightened, from a front side thereof.
Figure 10:
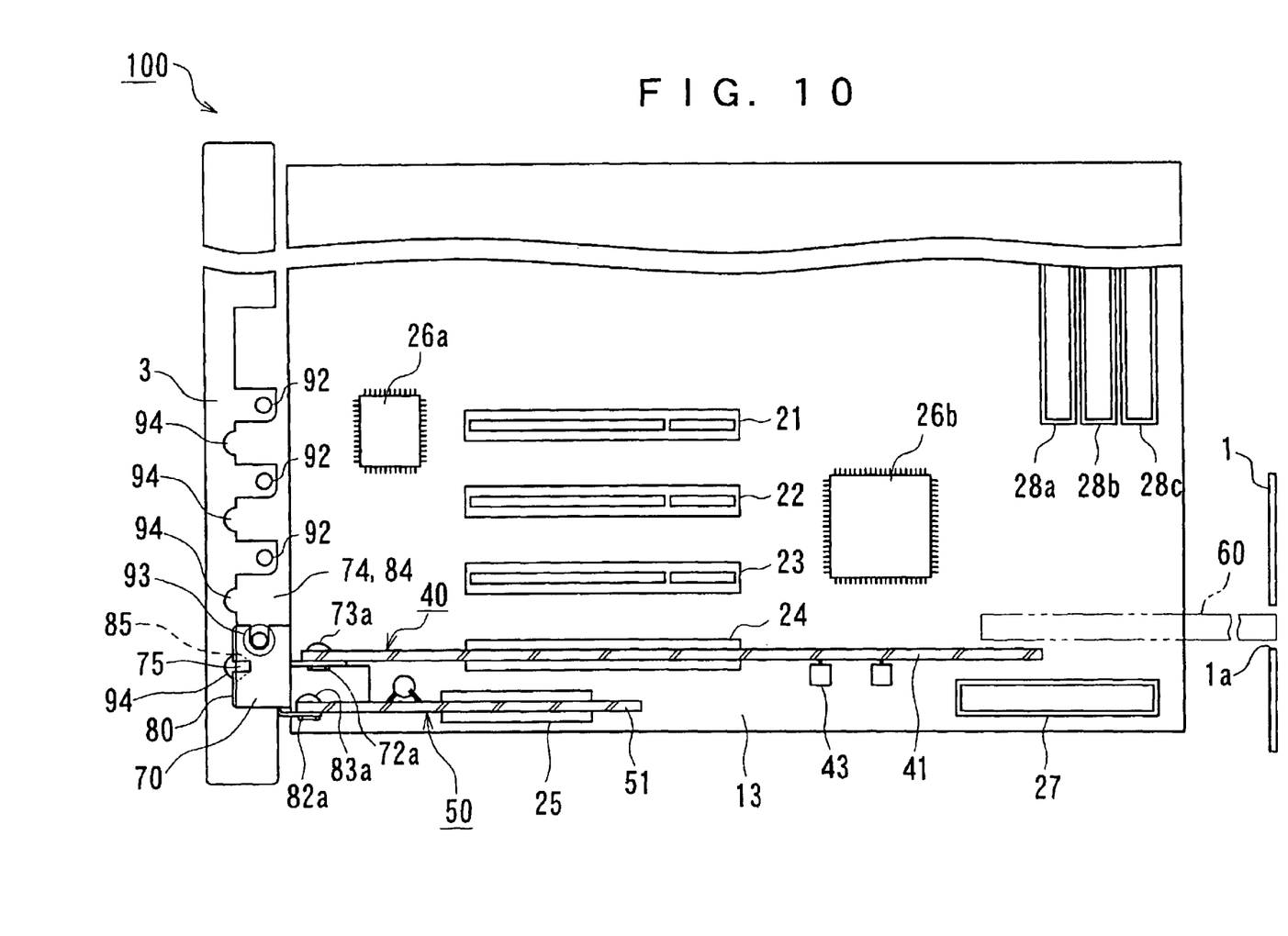
FIG. 10 is a diagram showing an exemplary structure of the expansion cards 40, 50 when they have been jointly tightened, from a top thereof.

Next, the method for allowing an electronic-parts-implementing board to be incorporated according to the invention will be described. FIG. 8 is a diagram showing an exemplary attachment of the PCI expansion card 40 and the CNR expansion card 50 from a front side thereof. FIG. 9 is a diagram showing an exemplary structure of these expansion cards wherein they are jointly tightened, from a front side thereof. FIG. 10 is a diagram showing an exemplary structure of these cards when they have been jointly tightened, from a top thereof.

In this embodiment, it is assumed that the PCI expansion card 40 is attached to the motherboard 13 in such a manner that the operation surface of the PC card is exposed from the opening 1a of the front plate 1 of a specific housing 2, and the CNR expansion card 50 is attached to the motherboard 13 in such a manner that to the slot 7d of the frame chassis 3, the operation surface for the outside line connectors and the like is exposed. This embodiment illustrates a case where the overlapping brackets of the PCI expansion card 40 and the CNR expansion card 50 are superimposed and jointly tightened with each other by screws. It is a matter of course that a screen plate of the slot 7d is in a removed state. In this manner, both of the expansion cards 40, 50 can be fixed to the frame chassis 3 by use of the parts attachment space of the slot 7d.

Under the assembling conditions described above, the motherboard 13 shown in FIG. 3 is prepared, and the motherboard 13 is attached inside the housing 2 in the same attachment method as conventional methods. The motherboard 13 is formed with 5 connectors 21, 22, 23, 24, 25 located at specific intervals.

Next, the printed circuit board 41 having the PCI card electrode 46 shown in FIG. 4 is prepared. The bracket 70 also shown in FIG. 4 is attached to the printed circuit board 41 to manufacture the PCI expansion card 40. At this time, the printed circuit board 41 and the bracket 70 are fixed with each other by screwing two male screws 73a, 73b into the female screws 72a, 72b formed in the main member 41.

Further, the printed circuit board 51 having the CNR card electrode 56 shown in FIG. 5 is prepared. The bracket 80 shown in FIG. 6A is attached to the printed circuit board 51 to manufacture the CNR expansion card 50. At this time, the printed circuit board 51 and the bracket 80 are fixed to each other by screwing two male screws 83a, 83b into the female screws 82a, 82b formed in the main member 51.

After that, as shown in FIG. 8, first, the CNR expansion card 50 is fittedly inserted into the connector 25 of the motherboard 13. At this time, the CNR card electrode 56 of the CNR expansion card 50 is fittedly inserted into the connector 25. Further, the convex projecting portion 84 of the bracket 80 shown in FIG. 6B is aligned with the half-round shaped notch portion 94 formed in the frame chassis 3.

Then, as shown in FIG. 8, in a state where the A side surface of the PCI expansion card 40 and the A side surface of the CNR expansion card 50 are opposed to each other, the PCI card electrode 46 slowly approaches the connector 24 and simultaneously, the bracket 70 of the PCI expansion card 40 is overlapped over the bracket 80 of the CNR expansion card 50. This allows the PCI expansion card 40 to be fittedly inserted into the connector 24.

At this time, since the PCI expansion card 40 is formed with the electronic-parts-implementing prohibitive region X beforehand, it is possible to combine the CNR expansion card 50 with the PCI expansion card 40 by spatially utilizing the electronic-parts-implementing prohibitive region X of the PCI expansion card 40. In this structure, the electronic-parts-implementing surfaces of the PCI expansion card 40 and the CNR expansion card 50 are opposed to each other, and thus, this avoids contacting the electronic parts with each other.

Further, when the bracket 70 of the PCI expansion card 40 is overlapped over the bracket 80 of the CNR expansion card 50, the convex projecting portion 75 of the bracket 70 shown in FIG. 4 is aligned with the concave notch portion 85 of the bracket 80 of the CNR expansion card 50, which has been described with reference to FIG. 6A. As a result of this alignment, at the time of joint tightening, the engaging portion 74 of the bracket 70 of the PCI expansion card 40 and the engaging portion 84 of the bracket 80 of the CNR expansion card 50 can be aligned with the portion of the frame chassis 3 where the female screw 92 is formed with excellent reproducibility.

As a result, as shown in FIG. 9, the bracket 70 of the PCI expansion card 40 and the bracket 80 of the CNR expansion card 50 can be easily jointly tightened with each other without depending on experts. In this manner, the PCI card electrode 46 of the PCI expansion card 40 can be electrically connected with the connector 24 of the motherboard 13, and the CNR card electrode 56 of the CNR expansion card 50 can be electrically connected with the connector 25 of the motherboard 13, in such a manner that the PC card operation site 60 of the PCI expansion card 40 shown in FIG. 10 is exposed from the opening 1a of the front plate 1 and the operation surface of the CNR expansion card 50 is exposed from the slot 7d of the frame chassis 3 shown in FIG. 9.

As described above, according to the personal computer 100 as an embodiment of the present invention, the A side surface of the PCI expansion card having the PCI card electrode 46 and the bracket 70 for joint tightening and the A side surface of the CNR expansion card 50 having the CNR card electrode 56 and the standardized bracket 80 are opposed to each other. Further, the bracket 70 and the bracket 80 are jointly tightened with the frame chassis 3 in such a manner that the card electrodes 46, 56 of the PCI expansion card 40 and the CNR expansion card 50 respectively are electrically connected with the connectors 24, 25 of the motherboard 13 inside the housing.

Accordingly, the PCI expansion card 40 of which PC card operation site 60 is exposed from the opening 1a of the front plate 1 and the CNR expansion card 50 of which the operation surface for the outside line connectors 57 is exposed from the slot 7d of the frame chassis 3 can be mounted on the motherboard 13 inside the housing by utilizing the parts attachment space of one and the same slot 7d.

As a result, the PCI expansion card 40 can be used at the front surface of the housing and the CNR expansion card 50 can be used at the back surface of the housing simultaneously, although only either one of such cards has been exclusively usable at the back surface of the housing or the front surface of the housing in the ATX (including Micro ATX) motherboard 13 and the like in a conventional system. Further, a space inside the computer can be efficiently used.

Thus has been described the present invention which is especially preferable for use in a desktop personal computer having a ATX motherboard capable of incorporating the electronic-parts-implementing board for extension of functionality. This invention is not limited to such the desktop personal computer having a ATX motherboard. Of course, the invention is applicable to a desktop personal computer having another standard motherboard.

While the foregoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus adapted to have electronic-parts-implementing boards, incorporated thereinto, said apparatus comprising:

a housing having a front surface and a back surface;

a first electronic-parts-implementing board having multiple board connection terminals being arranged mutually apart at a specific interval, said first electronic-parts-implementing board being incorporated in said housing;

a second electronic-parts-implementing board having a group of electrodes, said second-electronic-parts-implementing board being connected with one of the multiple board connection terminals of said first electronic-parts-implementing board with the group of electrodes of said second electronic-parts-implementing board being inserted into said one of the multiple board connection terminals of said first electronic-parts-implementing board, and said second electronic-parts-implementing board being used for extending a functionality of said first electronic-parts-implementing board; and     a third electronic-parts-implementing board having a group of electrodes, said third electronic-parts-implementing board being connected with an other one of the multiple board connection terminals of said first electronic-parts-implementing board with the group of electrodes of said third electronic-parts-implementing board being inserted into said other one of the multiple board connection terminals of said first electronic-parts-implementing board, and said third electronic-parts-implementing board being used for extension extending a functionality of said first electronic-parts-implementing board,     wherein each of said front and back surfaces of said housing has an opening for allowing an operation surface of one of said second and third electronic-parts-implementing boards to be exposed to an outside of the housing; and wherein in said second and third electronic-parts-implementing boards, the respective groups of electrodes of said second and third electronic-parts-implementing boards are inserted into the corresponding board connection terminals of said first electronic-parts-implementing board with an electronic-parts-implementing surface of said second electronic-parts-implementing board and an electronic-parts-implementing surface of said third electronic-parts-implementing board facing each other.

2. The apparatus according to claim 1, wherein the respective groups of electrodes of said second and third electronic-parts-implementing boards are electrically connected with the corresponding board connection terminals of said first electronic-parts-implementing board with the operation surface of said second electronic-parts-implementing board being exposed from the opening at the front surface of said housing and the operation surface of said third electronic-parts-implementing board being exposed from the opening at the back surface of said housing.

3. The apparatus according to claim 1,
wherein said second electronic-parts-implementing board comprises an electronic-parts-implementing prohibitive region; and
wherein said third electronic-parts-implementing board is joined with said second electronic-parts-implementing board by spatially utilizing the electronic-parts-implementing prohibitive region in said second electronic-parts-implementing board.

4. The apparatus according to claim 1,
wherein said second electronic-parts-implementing board includes a support-fixing member having an engaging portion for screw fastening;
wherein said third electronic-parts-implementing board includes a support-fixing member having an engaging portion for screw fastening; and
wherein the engaging portion of the support-fixing member of said second electronic-parts-implementing board and the engaging portion of the support-fixing member of said third electronic-parts-implementing board are jointly tightened and fastened to said housing.

5. The apparatus according to claim 4,
wherein said support-fixing member of said second electronic-parts-implementing board is arranged on an electronic-parts-implementing surface side of said second electronic-parts-implementing board;
wherein said support-fixing member of said third electronic-parts-implementing board is arranged on a non-electronic-parts-implementing surface side of said third electronic-parts-implementing board; and
wherein the supporting-fixing member of said second electronic-parts-implementing board and the support-fixing member of said third electronic-parts-implementing board are arranged in an overlapped state.

6. The apparatus according to claim 4,
wherein the support-fixing member of said second electronic-parts-implementing board has a convex projecting portion for alignment;
wherein the support-fixing member of said third electronic-parts-implementing board has a concave notch portion for alignment; and
wherein, when jointly tightening, the convex projecting portion of the support-fixing member of said second electronic-parts-implementing board is inserted into the concave notch portion of the support-fixing member of said third electronic-parts-implementing board to be fitted with each other.

7. The apparatus according to claim 6,
wherein the concave notch portion of the support-fixing member of said third electronic-parts-implementing board has a convex projecting portion for alignment;
wherein said housing includes one of a concave notch portion for alignment and a circular opening for alignment; and
wherein, when jointly tightening, the convex projecting portion of the support-fixing member of said third electronic-parts-implementing board is inserted into one of the concave notch portion and the circular opening of said housing to be fitted with each other.

8. A method for adapting an electronic-parts-implementing board to be incorporated with an operation surface of said electronic-parts-implementing board being exposed through an opening formed in a housing at front surface and back surface thereof, said method comprising the steps of:
incorporating a first electronic-parts-implementing board having multiple board connecting terminals being arranged mutually apart at a specific interval inside said housing;
preparing a second electronic-parts-implementing board having a group of electrodes for connecting said second electronic-parts-implementing board with said first electronic-parts-implementing board and a third electronic-parts-implementing board having a group of electrodes for connecting said third electronic-parts-implementing board with said first electronic-parts-implementing board, and locating said second and third electronic-parts-implementing boards with an electronic-parts-implementing surface of said second electronic-parts-implementing board and an electronic-parts-implementing surface of said third electronic-parts-implementing board facing each other; and
connecting the group of electrodes of said second electronic-parts-implementing board with one of the board connection terminals of said first electronic-parts-implementing board, and connecting the group of electrodes of said third electronic-parts-implementing board with an other one of the board connection terminals of said first electronic-parts-implementing board.

9. The method according to claim 8, wherein the respective groups of electrodes of said second and third electronic-parts-implementing boards are electrically connected with the board connection terminals of said first electronic-parts-implementing board with the operation surface of said second electronic-parts-implementing board being exposed from the opening at the front surface of said housing and the operation surface of said third electronic-parts-implementing board being exposed from the opening at the back surface of said housing.

10. The method according to claim 8, further comprising the steps of:
setting an electronic-parts-implementing prohibitive region in said second electronic-parts-implementing board; and
joining said third electronic-parts-implementing board together with said second electronic-parts-implementing board by spatially utilizing the electronic-parts-implementing prohibitive region in said second electronic-parts-implementing board.

11. The method according to claim 8, further comprising the steps of:
- installing a support-fixing member having an engaging portion for screw fastening in said second electronic-parts-implementing board;
- installing a support-fixing member having an engaging portion for screw fastening in said third electronic-parts-implementing board; and
- jointly tightening the engaging portion of the support-fixing member of said second electronic-parts-implementing board and the engaging portion of the support-fixing member of said third electronic-parts-implementing board and fastening them to said housing.

12. The method according to claim 11, further comprising the steps of:
- installing the support-fixing member in said second electronic-parts-implementing board on the electronic-parts-implementing surface side of said electronic-parts-implementing board, and
- installing the support-fixing member in said third electronic-parts-implementing board on non-electronic-parts-implementing surface side of said third electronic-parts-implementing board, and
- fixing, in the jointly tightening step, the supporting fixing member of said second electronic-parts-implementing board and the support-fixing member of said third electronic-parts-implementing board in an overlapped state.

13. The method according to claim 11, further comprising the steps of:
- providing a convex projecting portion for alignment to the support-fixing member of said second electronic-parts-implementing board;
- providing a concave notch portion for alignment to the support-fixing member of said third electronic-parts-implementing board; and
- inserting, in the jointly tightening step, the convex projecting portion of the support-fixing member of said second electronic-parts-implementing board into the concave notch portion of the support-fixing member of said third electronic-parts-implementing board and fitting them with each other.

14. The method according to claim 13, further comprising the steps of:
- providing a convex projecting portion for alignment to the concave notch portion of the support-fixing member of said third electronic parts-implementing board;
- forming one of a concave notch portion for alignment and circular opening for alignment in said housing; and
- inserting, in the jointly tightening step, the convex projecting portion of the support-fixing member of said third electronic-parts-implementing board into one of the concave notch portion and the circular opening of said housing and fitting them with each other.

* * * * *